(12) United States Patent
Chen et al.

(10) Patent No.: US 6,385,748 B1
(45) Date of Patent: May 7, 2002

(54) DIRECT ACCESS LOGIC TESTING IN INTEGRATED CIRCUITS

(75) Inventors: Ping Chen; Wern-Yan Koe, both of San Jose, CA (US)

(73) Assignee: NEC Electronics, Inc., Santa Clara, CA (US)

(*) Notice: Subject to any disclaimer, the term of this patent is extended or adjusted under 35 U.S.C. 154(b) by 0 days.

(21) Appl. No.: 09/281,370

(22) Filed: Mar. 30, 1999

(51) Int. Cl.⁷ .................................................. G01R 31/28
(52) U.S. Cl. ........................................ 714/724; 365/201
(58) Field of Search ................................ 714/724, 726, 714/727, 735, 745, 725, 218, 200, 234, 30, 728, 733, 718, 734, 8, 33; 712/38, 226; 709/204; 324/158.1, 380, 402, 393; 710/260, 263, 269, 48, 267; 326/46; 365/200, 201, 222, 233, 230.03; 716/4

(56) References Cited

U.S. PATENT DOCUMENTS

| | | | | |
|---|---|---|---|---|
| 4,726,023 A | * | 2/1988 | Carter et al. | 714/33 |
| 5,515,296 A | * | 5/1996 | Agarwal | 709/204 |
| 5,812,561 A | * | 9/1998 | Giles et al. | 714/726 |
| 5,872,908 A | * | 2/1999 | Whetsel | 714/30 |
| 5,923,097 A | * | 7/1999 | Corriveau et al. | 307/29 |
| 5,954,824 A | * | 9/1999 | Cherichetti et al. | 714/28 |
| 6,044,481 A | * | 3/2000 | Kornachuk et al. | 714/724 |
| 6,178,534 B1 | * | 1/2001 | Day et al. | 714/745 |
| 6,289,477 B1 | * | 9/2001 | Gunadisastra | 714/724 |

OTHER PUBLICATIONS

Dreibelbis, J. et al(An ASIC library granular DRAM macro with built–in self test ; IEEE, Sep. 21, 1990)t; IEEE, Feb. 7, 1998).*
Perrey, K. et al (An assembler approach to the automation of test vector generation; IEEE, Sep. 21, 1990).*
De, K. (Test methodology for embedded cores which protects intellectual property; IEEE, May 1, 1997).*
System Diagnostics Through Complete Field Replacement Units; IBM Technical Disclosure Bulletin; Apr. 1989, US; NN8904390.*
Producing Integrated Circuits From a Circuit Logic Input; IBM Technical Disclosure Bulletin; Oct. 1970, US; NN70101084.*

* cited by examiner

Primary Examiner—Albert Decady
Assistant Examiner—Guy Lamarre
(74) Attorney, Agent, or Firm—Skjerven Morrill MacPherson LLP

(57) ABSTRACT

A method and circuit for allowing direct access logic testing in integrated circuits. In one embodiment, an interface between integrated circuit core logic and integrated circuit user-defined logic is exposed, and the integrated circuit core logic and the integrated circuit user-defined logic is tested via the exposed interface. In another embodiment, an integrated circuit has logic selection circuitry connected with core logic and user-defined logic. The logic selection circuitry is used to selectively test the core logic and user-defined logic.

32 Claims, 3 Drawing Sheets

DIRECT ACCESS LOGIC TESTING IN INTEGRATED CIRCUITS

BACKGROUND OF THE INVENTION

1. Field of the Invention

This invention relates to the field of integrated circuit testing.

2. Description of the Related Art

An integrated circuit (IC) is a miniature electric circuit containing large numbers of discrete electronic circuit elements, such as transistors, resistors, capacitors, and diodes, which are packaged as a single unit with leads extending from it for input, output, and power-supply connections. The electronic circuit elements are formed by selective manipulation of a single chip of semiconductor material, often in combination with various other semiconducting and/or conducting materials.

It is common in the art to roughly classify integrated circuits dependent upon their transistor density. Presently, there are effectively four common integrated circuit classifications: small-scale integrated circuits (SSIs); medium-scale integrated circuits (MSIs); large-scale integrated circuits (LSIs); and very-large-scale integrated circuit (VLSIs). Exactly what transistor densities constitute the various "classes" varies, but at present SSIs typically include up to several tens of transistors, MSIs include from many tens to several hundred transistors; LSIs include from several hundred to a few thousand transistors; and VLSIs several hundred thousand or more. Most ICs in use today would constitute VLSIs.

One powerful feature of integrated circuits is the ability to use such integrated circuits to produce several levels of abstraction, which is useful for complete design. For example, integrated circuit design can be viewed at one level of abstraction in terms of discrete electronic circuit components (e.g., resistors, capacitors, inductors, transistors, diodes, etc.). Integrated circuit design can also be viewed at a next-higher layer of abstraction in terms of logic diagrams consisting of well-defined digital boolean logic circuits such as AND, NAND, OR, and NOR gates, where each such gate consists of well-defined congeries of the discrete electronic circuit elements. Integrated circuit design can also be viewed at yet a next-higher layer of abstraction known as Register Transfer Level (RTL), which consists of program-like statements describing the movement or processing of data between storage elements. Integrated circuits can also be viewed at a yet again higher layer of abstraction known as a functional block diagram layer, which shows the major subcomponents of a design. This is the level at which the highest conceptual design work is done.

Typically, IC design is done at the functional block diagram, RTL, and logic diagram levels. It is common for whole teams of people (and sometimes whole companies) to focus on various aspects of the design at various abstraction levels. However, as noted, the design process rarely proceeds at a lower level than that of logic diagrams. Below this level, it is common to program the desired logic diagram layouts into artificially intelligent software, which automatically produces discrete circuit component level diagrams to be enacted within the integrated circuit.

A particular type of IC is known as an Application Specific Integrated Circuit (ASIC). An ASIC is an integrated circuit that is designed and built to perform a particular set of functions via the use of an integrated circuit. One example of a way in which ASICs are commonly used is provide hardware implementations of computer software application programs. That is, use of ASICs allows system designers to work at and design at a software layer of abstraction in order to produce and debug a computer software application program to perform a desired function. Thereafter, the higher-level software layer of abstraction level of design can be translated to hardware level design via the use of various techniques well-known in the art, such as the Very High Speed Integrated Circuit Hardware Description Language (VHDL). The hardware level design can then be implemented in an IC, and since the IC will be designed to implement a particular application program, it has become common in the art to refer to such ICs as "Application Specific" ICs, or ASICs.

Those skilled in the art will recognize that ASICs do not operate in a vacuum. That is, it is common, even in environments where ASICS are utilized, for the ASICs to interface and/or utilize one or more standard data processing system components, such as additional processing devices (e.g., one or more central processing units (CPUs), or dedicated graphics processors), communications channels (e.g., Peripheral Component Interface (PCI), or Advanced Graphics Processing (AGP) data buses).

In the past, the presence of ASICs in an environment typically meant that an independent, freestanding, IC existed for each ASIC present in addition to any other more standard integrated circuits necessary to support the system. However, efforts are now being made within the industry to move toward System-On-a-Chip (SOC) designs wherein any desired ASICs are actually designed into, and made part of, ICs which have one or more pre-existing "cores" which provide the IC with logic sufficient to provide one or more standard functions, such as the functions of one or more standard data processing system components. It is common in the art to refer to non-core logic, such as an ASIC, as user-defined logic (UDL). An example of such a SOC is shown in FIG. 1.

With reference to FIG. 1, shown is a partial functional block diagram level related art integrated circuit SOC 100. As shown, contained within SOC 100 are CPU core 102, on-chip processor bus 104, on-chip bridge 106, system memory 107, on-chip peripheral component internal (PCI) bus 108, and peripheral bus components 110–114, and ASIC 116 (an example of UDL).

SOC 100 is a functional block diagram representation of various functional blocks performing their various functions. As referenced above, the actual implementation of the various functional blocks within any IC containing SOC 100 will be via the use of perhaps several hundred thousand interconnected discrete circuit level components.

As noted above, the discrete circuit level components are produced via the selective manipulation of a single piece of semiconductor material, where such selective manipulation usually includes the use of other semi-conducting and/or conducting materials. The discrete circuit level components are created via this selective manipulation.

The regions affected by the selective manipulation of the single piece of semiconductor material are almost unimaginably small. For example, current VLSI production procedures produce the discrete circuit components by manipulating material by use of sub-micron width (i.e., widths of less that (1/1,000,000) of a meter) lines drawn, or "etched," in the semiconductor material. Furthermore, the sizes of the regions manipulated decrease virtually every week.

Due to the very small regions manipulated during VLSI production, errors invariably occur. This can be the result of contamination of the material, or minor variations in the length, width, or height of lines etched. These errors in production often result in errors in the behavior of the discrete electronic circuit level components.

As noted, the higher abstraction logic diagram level is designed using logic diagram level component circuits consisting of congeries of discrete circuit level components. Consequently, errors in production sufficient to produce errors in the behavior of the discrete circuit level components can "propagate" upwards to the logic diagram level since the logic diagram circuits are built from congeries of these malfunctioning circuit components. If the errors are severe, then such malfunctioning will be very apparent in that the affected logic diagram level circuits will not function. However, if the malfunction is not severe, it is possible that the affected logic diagram level components will perform, but will perform in such a way that is out of design tolerances, which can cause a general system malfunction or failure as these logic diagram level errors "propagate" up the abstraction-layer hierarchy to affect the RTL and functional block diagram level designs.

A principal way in which such a malfunction will manifest at the logic diagram level is that one or more of the logic diagram level circuits will perform their functions appropriately, but so slowly that they affect the design. Accordingly, testing has been devised in the art to ensure that the logic diagram level circuits are performing their functions within design tolerances. This testing basically amounts to the following: (1) defining at least one combinational logic path through a combinational logic circuit; (2) initializing the combinational logic circuit with a given set of inputs; (3) waiting until the combinational logic circuit becomes stable; (4) changing the logic levels of one or more of the set of inputs; and (5) and measuring the time it takes for output of the combinational logic circuit at the end of the defined path to change subsequent to the change in the set of inputs.

As noted, SOC 100 is composed of both vendor-defined "core" logic and UDL. Also as noted, the finished IC is typically tested via the measurement of delays through various defined paths through the combinational logic of the IC. With respect to defined paths through the core logic, there are typically well-defined testing patterns and access points within the logic which are utilized to ensure that the core logic is functioning correctly. Likewise with respect to the standalone UDL; that is, there are typically well-defined testing patterns and access points within the logic which are utilized to ensure that the user-defined logic is functioning correctly. However, when the core logic and the user-defined logic are integrated onto one IC, such integration usually destroys the ability to independently test the UDL and the core logic. That is, subsequent to integration, newer overall path test patterns and logic paths are typically utilized.

There are several reasons why new test patterns and logic paths are utilized, but a primary reason is that within the art there is a lack of ability to practicably expose, separate, and/or test the UDL from the core logic subsequent to integration. It is not uncommon for designs to fail to satisfy the new testing criteria applied subsequent to integration of the UDL with the core logic.

When the integrated UDL and core logic fail to perform as expected, the reasons for such failure can range from the fact that the overall integration design was faulty or because either or both the UDL and core logic are not performing as they should (e.g., errors during production have caused either or both the UDL and core logic to malfunction). Those skilled in the art will recognize that it would be desirable to test the core logic and UDL independent of each other, in that well established testing criteria are available to test both the core and the UDL, and that it is desirable to localize the problem area or areas in the design if at all possible. However, at present there is in the art no practicable way to maintain the ability to independently access and test the core and UDL subsequent to integration. It is therefore apparent that a need exists in the art to allow the practicable independent access to and testing of the core and UDL subsequent to integration.

SUMMARY OF THE INVENTION

A method and circuit have been devised which allow the practicable independent access to and testing of UDL and core logic subsequent to integration of the UDL and core logic in an integrated circuit. The method and circuit allow direct access logic testing in integrated circuits. In one embodiment, an interface between integrated circuit core logic and integrated circuit user-defined logic is exposed, and the integrated circuit core logic and the integrated circuit user-defined logic is tested via the exposed interface. In another embodiment, an integrated circuit has logic selection circuitry connected with core logic and user-defined logic. The logic selection circuitry is used to selectively test the core logic and user-defined logic.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The following sets forth a detailed description of the best contemplated mode for carrying out the invention as described in the claims. The detailed description is intended to be illustrative and should not be taken as limiting.

Figure 1:
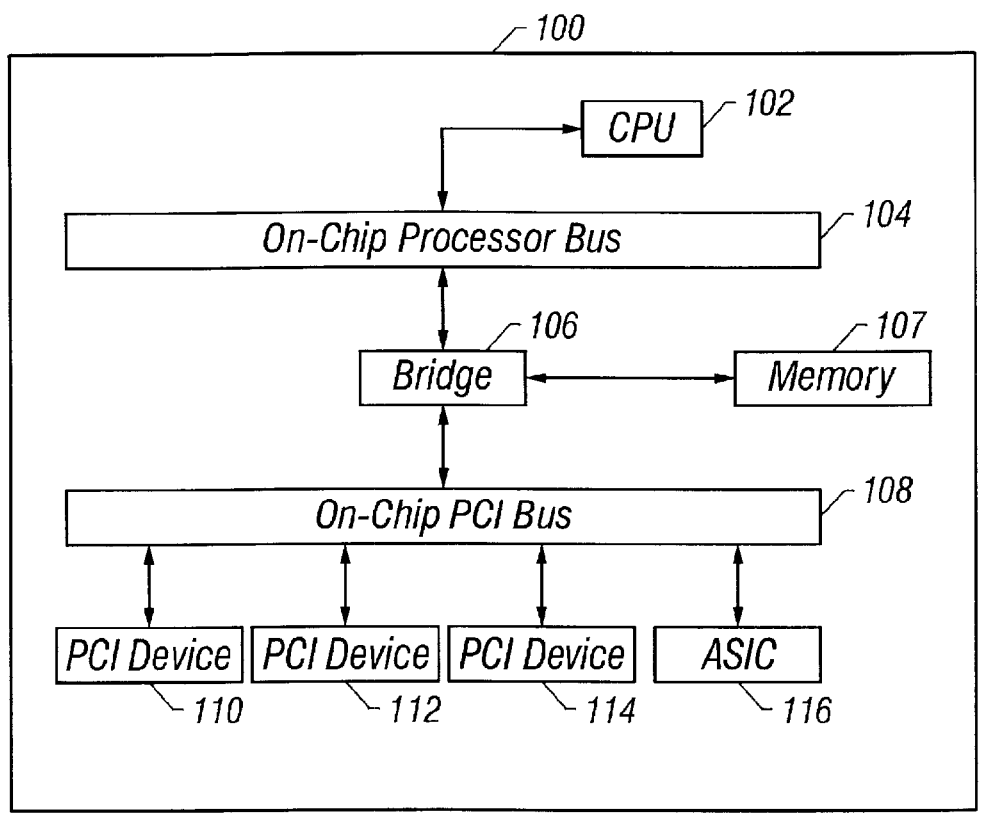
FIG. 1 is a partial functional block diagram level showing a related art integrated circuit System-On-a-Chip.
Figure 2:
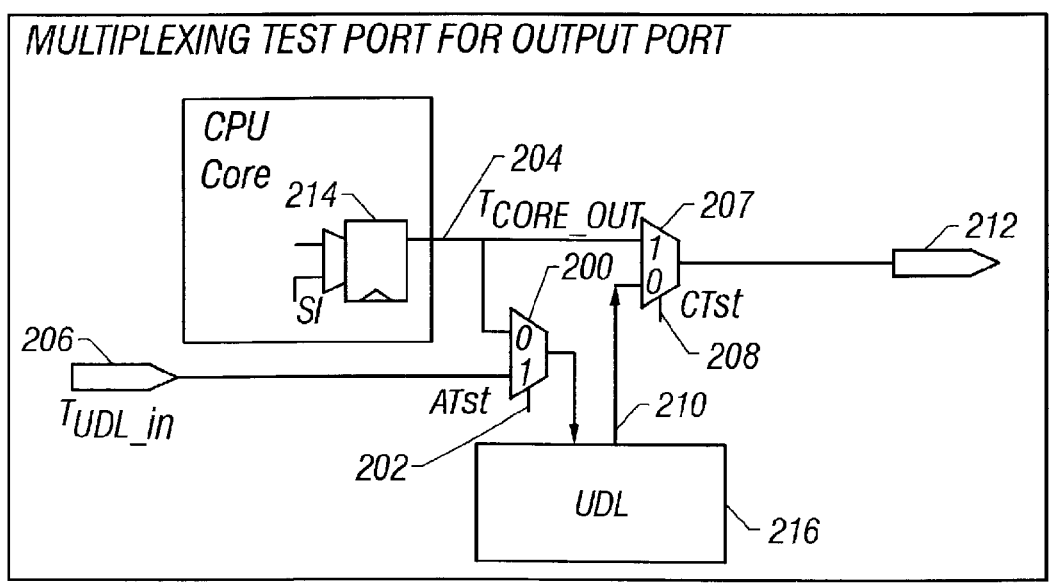
FIG. 2 depicts an embodiment of the present invention especially useful in the context of an integrated circuit having uni-directional signals from integrated circuit core logic outputs to integrated circuit UDL inputs.
Figure 3:
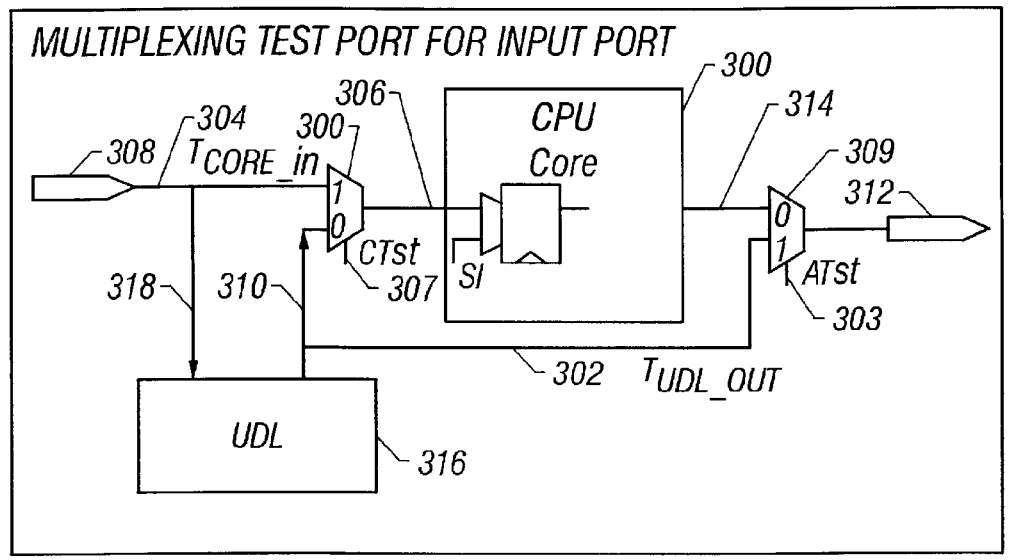
FIG. 3 depicts an embodiment of the present invention especially useful in the context of an integrated circuit having uni-directional signals from integrated circuit UDL outputs to integrated circuit core logic inputs.
Figure 4:
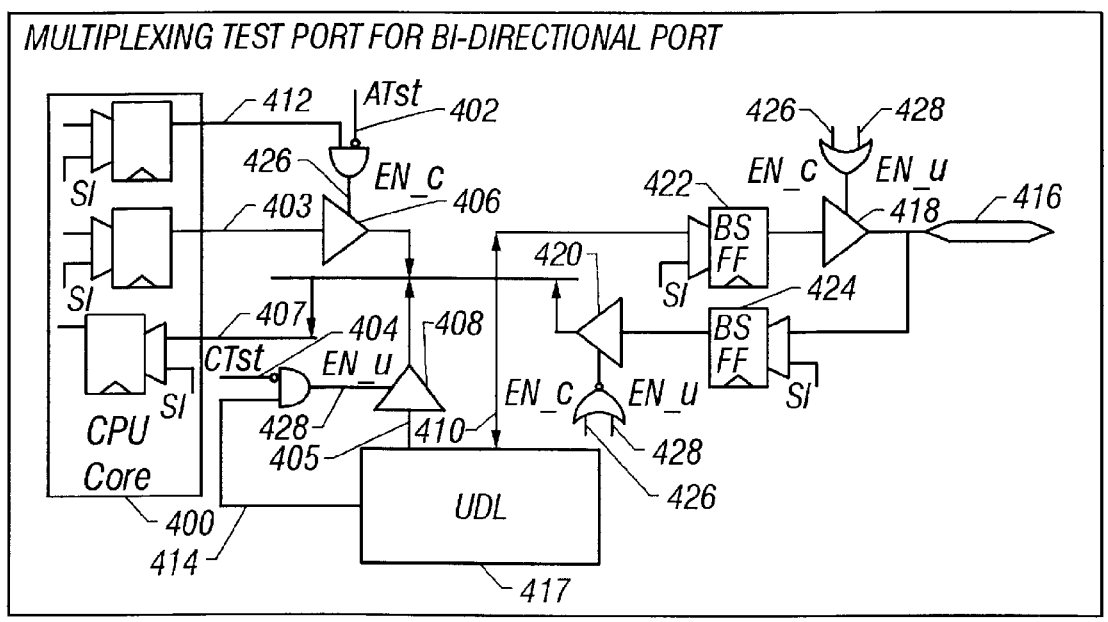
FIG. 4 illustrates an embodiment of the present invention in the context of an integrated circuit having bi-directional signals between integrated circuit core logic and integrated circuit UDL.

In various embodiments of the present invention, the various cores and UDL are fully verified (i.e., accessed and tested) independent of each other. The various embodiments of the present invention provide several modes of operation, examples of which are illustrated in FIGS. 2, 3, and 4 in conjunction with Table 1. Table 1 illustrates that in certain exemplary embodiments, the control of the exemplary modes is achieved by two test control signals, ATst and CTst.

TABLE 1

Test Mode Definition

| ATst | CTst | Mode |
|---|---|---|
| 0 | 0 | Normal system operation mode |
| 0 | 1 | CPU core test mode |
| 1 | 0 | UDL test mode |
| 1 | 1 | illegal |

Certain embodiments of the present invention support the three operation modes illustrated within Table 1 by providing an I/O interface between at least one core and at least one UDL which allows usage of the mode select signals (i.e. ATst or CTst) illustrated in Table 1. The embodiments set forth below illustrate three types of interface signals: (1) FIG. 2 shows an embodiment in the context of an IC having uni-directional signals from integrated circuit core logic outputs to integrated circuit UDL inputs; (2) FIG. 3 depicts an embodiment in the context of an IC having uni-directional signals from integrated circuit UDL outputs to integrated circuit core logic inputs; and (3) FIG. 4 illustrates an embodiment in the context of an IC having bi-directional signals between integrated circuit core logic and integrated circuit UDL. It will be understood by those in the art that these interface signals have to be brought out to the external pins, via procedures notorious within the art, in order to gain direct access for testing purpose.

With reference now to FIG. 2, shown is an embodiment of the present invention especially useful in the context of an IC having uni-directional signals from integrated circuit core logic outputs to integrated circuit UDL inputs. Depicted is that input multiplexer 200, controlled by ATst signal 202, is used to select an input either from core output 204 or from UDL test input pin 206. Illustrated is that output multiplexer 207, controlled by CTst signal 208, is used to route UDL output 210 or core output 204 to output pin 212.

Under the normal system mode (i.e., when testing is not being performed), both ATst signal 202 and CTst signal 208 are set to logical zero. The output from core wrapper flip-flop 214 goes into UDL 216 and UDL output 210 is connected to output pin 212.

Under the core test mode, ATst signal 202 is set to logical zero and CTst signal 208 is set to logical one. The core output value 204 is propagated to output pin 212 in this case. Shown is that in the core test mode core out 204 can be used as an output signal ($T_{core\_out}$) in response to some core logic testing pattern applied.

Under the UDL test mode, ATst signal 202 is set to one and CTst signal 208 is set to zero. UDL 216 gets its input value ($T_{UDL\_in}$) from UDL test input pin 206 and its output 210 is selected to output pin 212 by output multiplexer 207 which is controlled by CTst signal 208.

Referring now to FIG. 3, depicted is an embodiment of the present invention especially useful in the context of an IC having uni-directional signals from integrated circuit UDL outputs to integrated circuit core logic inputs. Illustrated is that input multiplexer 300, controlled by CTst signal 307, is used to select either UDL output 310 or test input signal ($T_{core\_in}$) 304 from input pin 308 as core input 306. Output multiplexer 309, controlled by ATst signal 303, is used to select core logic output 314 or UDL test output signal ($T_{UDL\_out}$) 302 to output pin 312.

Under the normal system mode, CTst signal 307 is set to zero in order to set core input value 306 as UDL output 310. ATst signal 303 is set to zero such that core output 314 is connected to output pin 312.

Under the core test mode, test input 304 is connected as core input signal 306 by having CTst signal 307 set to logical one and core output 314 is routed to output pin 312 by having ATst signal 303 set to logical zero.

Under the UDL test mode, UDL 316 receives UDL input value 318 from input pin 308. The output ($T_{UDL\_out}$) of UDL 316 during UDL testing mode is via UDL output path 302 to output pin 312, created by setting ATst signal 303 to logical one.

With reference now to FIG. 4, illustrated is an embodiment of the present invention in the context of an IC having bi-directional signals between integrated circuit core logic and integrated circuit UDL. Shown are four tristate buffers 406, 408, 418, and 420. The four tristate buffers 406, 408, 418, and 420 are controlled by ATst signal 402, CTst signal 404, and output buffer enable signals EN_c 426 and EN_u 428 which are used to avoid the potential problem of bi-directional bus contention.

Under normal system mode, ATst signal 402 and CTst signal 404 are set to logical zero. The normal path of the bi-direction signal is between core 400 and UDL 417. Both output tristate buffers 406, 408 of core 400 and UDL 417, respectively, are activated and gain direct control from the internal output enable signals 412, 414. These two buffers 406, 408 can never be turned on at the same time since the internal output enable signals 412, 414 for core 400 and UDL 417 are mutually exclusive because output enable signals are determined by the preexisting internal logic of the chip proper (that is, the logic of the chip in the absence of the present invention) and consequently internal output enable signals 412, 414 will not be turned on at the same time.

When the output buffer 406 of core 400 is enabled, UDL 417 is in the input state and gets UDL input value 410 from core output 403. When output buffer 408 of UDL 417 is enabled, core 400 is in the input state and gets its input signal 407 from UDL output 405. As shown, the input 407/output 403 of core 400 is connected to external bi-directional pin 416 through the tristate buffers 418, 420 of boundary scan flip-flops 422, 424. The tristate buffer 418 of the output scan flip-flop 422 is turned on whenever either of the output buffers 406, 408 of core 400 or UDL 417 is enabled (which means that at least one of output buffer enable signals EN_c 426 and EN_u 428 are set to logical 1). The tristate buffer 420 of the input scan flip-flop 424 is enabled when both output buffers 406, 408 are disabled (which means that both output buffer enable signals EN_c 426 and EN_u 428 are set to logical zero). During the output state of core 400, output 403 is routed to external pin 416 since its output buffer 406 and the output buffer 418 of the output boundary flip-flop 422 are enabled. During the input state of core 400, its input 407 is connected to the external pin 416 since the tristate buffer 420 of the input boundary scan flip-flop 424 is enabled. Under the core test mode, output tristate buffer 408 of UDL 417 is disabled by setting CTst signal 404 to one. Under the UDL test mode, UDL 417 outputs to the external pin 416 with both its output buffer 408 and the buffer 418 of the output boundary flip-flop 422 enabled in the output state. UDL 417 gets input value from external pin 416 with the tristate buffer 420 of the input boundary flip-flop 424 enabled.

Figure 5:
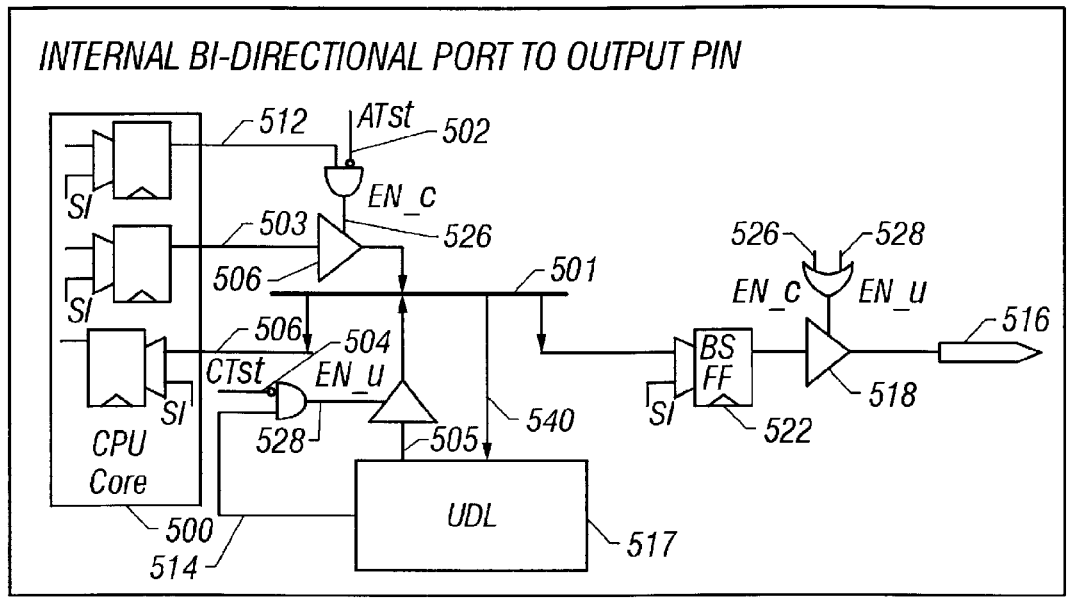
FIG. 5 shown is a related-art environment wherein the embodiment of the invention set forth in FIG. 3 proves particularly useful.

Referring now to FIG. 5, shown is a related-art environment wherein the embodiment of the invention set forth in FIG. 3 proves particularly useful. Depicted is a system which provides a bi-directional connection between core 500 and UDL 517, but such that the path from internal bi-directional connection 501 to external pin 516 is unidirectional. This unidirectional path is an output path and is active only when either core 500 or UDL 517 is in an output state. Thus, it is not possible to control the internal bi-directional signal from the external pin 516 during the test modes depicted in Table 1.

In order to create a direct input path as well as output path from the external pin, this related-art type of interface can be converted to the interface shown in FIG. 3. In that way, the signal that connect the core, the UDL and the output pin is bi-directional and the direct access from the external pin is possible.

Figure 6:
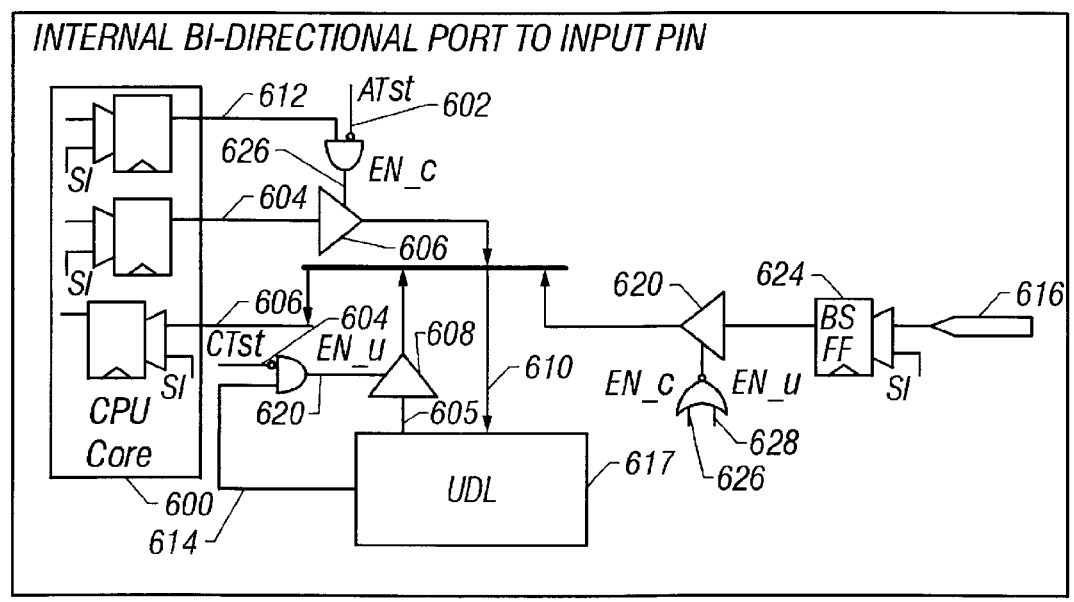
FIG. 6 shown is a related-art environment wherein the embodiment of the invention set forth in FIG. 3 proves particularly useful.

With reference now to FIG. 6, shown is a related-art environment wherein the embodiment of the invention set forth in FIG. 3 proves particularly useful. The type of interface signal shown in FIG. 6 has a bi-directional path between core 600 and UDL 617, but it has only an input path from external pin 616. Outputs from core 600 or UDL 617 will not be observable from the external pin 616 during the test modes depicted in Table 1.

In order to create an output path as well as an input path from external pin 616, this related-art type of interface can be converted to the interface shown in FIG. 3. In that way, the signal that connects core 600, UDL 617 and external pin 616 is bidirectional and the direct access from external pin 616 is possible.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

The foregoing described embodiments depict different components contained within, or connected with, different other components. It is to be understood that such depicted architectures are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles used to introduce claim elements.

What is claimed is:

1. A method comprising:

exposing an interface between integrated circuit core logic and integrated circuit user-defined logic; wherein said exposing an interface between integrated circuit core logic and integrated circuit user-defined logic further includes:

selectively decoupling the integrated circuit core logic from the integrated circuit user-defined logic, wherein said selectively decoupling the integrated circuit core logic from the integrated circuit user-defined logic further includes selectively controlling a signal at the interface between the integrated circuit core logic and the integrated circuit user-defined logic; and testing the integrated circuit core logic and the integrated circuit user-defined logic via the exposed interface.

2. The method of claim 1, wherein said selectively controlling a signal at the interface between the integrated circuit core logic and integrated circuit user-defined logic further includes:

selectively controlling a multiplexer between an integrated circuit core logic output and an integrated circuit user-defined logic input.

3. The method of claim 2, wherein said selectively controlling a multiplexer between an integrated circuit core logic output and an integrated circuit user-defined logic input further includes:

controlling the multiplexer such that either an integrated circuit user-defined logic test signal or an integrated circuit core logic output signal is delivered to the integrated circuit user-defined logic input.

4. The method of claim 1, wherein said selectively controlling a signal at the interface between the integrated circuit core logic and integrated circuit user-defined logic further includes:

selectively controlling a multiplexer between an integrated circuit user-defined logic output and an output pin.

5. The method of claim 4, wherein said selectively controlling a multiplexer between an integrated circuit user-defined logic output and an output pin further includes:

controlling the multiplexer such that either an integrated circuit core logic output signal or an integrated circuit core logic output signal is delivered to the output pin.

6. The method of claim 1, wherein said selectively controlling a signal at the interface between the integrated circuit core logic and the integrated circuit user-defined logic further includes:

selectively controlling a multiplexer between an integrated circuit user-defined logic output and an integrated circuit core logic input.

7. The method of claim 6, wherein said selectively controlling a multiplexer between an integrated circuit user-defined logic output and an integrated circuit core logic input further includes:

controlling the multiplexer such that either an integrated circuit core logic test signal or an integrated circuit user-defined logic output signal is delivered to the integrated circuit core logic input.

8. The method of claim 1, wherein said selectively controlling a signal at the interface between the integrated circuit core logic and the integrated circuit user-defined logic further includes:

selectively controlling a multiplexer between an integrated circuit core logic output and an output pin.

9. The method of claim 8, wherein said selectively controlling a multiplexer between an integrated circuit core logic output and an output pin further includes:

controlling the multiplexer such that either an integrated circuit core logic test signal or an integrated circuit user-defined logic output signal is delivered to the output pin.

10. The method of claim 1, wherein said selectively controlling a signal at the interface between the integrated circuit core logic and the integrated circuit user-defined logic further includes:

selectively controlling a bi-directional bus interface between the integrated circuit core logic and the integrated circuit user-defined logic.

11. The method of claim 10, wherein said selectively controlling a bi-directional bus interface further includes:

selectively controlling a signal path between an external pin and a bi-directional bus.

12. The method of claim 11, wherein said selectively controlling a signal path between an external pin and a bi-directional bus further includes:

selectively enabling an output signal path from the bi-directional bus to the external pin.

13. The method of claim 11, wherein said selectively controlling a signal path between an external pin and a bi-directional bus further includes:

selectively enabling an input signal path from the external pin to the bi-directional bus.

14. The method of claim 10, wherein said selectively controlling a bi-directional bus interface further includes:

selectively controlling a signal path between a bi-directional bus and integrated circuit logic.

15. The method of claim 14, wherein said selectively controlling a signal path between a bi-directional bus and integrated circuit logic further includes:

selectively enabling an input signal path from the bi-directional bus to the integrated circuit core logic.

16. The method of claim 14, wherein said selectively controlling a signal path between a bi-directional bus and integrated circuit logic further includes:

selectively enabling an output signal path from the integrated circuit core logic to the bi-directional bus.

17. The method of claim 14, wherein said selectively controlling a signal path between a bi-directional bus and integrated circuit logic further includes:

selectively enabling an input signal path from the bi-directional bus to the integrated circuit user-defined logic.

18. The method of claim 14, wherein said selectively controlling a signal path between a bi-directional bus and integrated circuit logic further includes:

selectively enabling an output signal path from the integrated circuit user-defined logic to the bi-directional bus.

19. An integrated circuit comprising:

core logic;

user-defined logic; and logic selection circuitry connected with said core logic and said user-defined logic, wherein said logic selection circuitry is connected with an external pin, wherein said logic selection circuitry connected with said core logic and user-defined logic further includes at least one multiplexer operably connected between the core logic output and the user-defined logic input.

20. The circuit of claim 19, wherein said at least one multiplexer operably connected to the core logic and the user-defined logic further includes:

a multiplexer operably connected to a user-defined logic output and a core logic output; and said multiplexer operably connected with said external pin.

21. The circuit of claim 19, wherein said at least one multiplexer operably connected to the core logic and the user-defined logic further includes:

a multiplexer operably connected between a user-defined-logic output and a core logic input.

22. The circuit of claim 21, wherein said multiplexer operably connected between a user-defined logic output and a core logic input further includes:

an input of the multiplexer operably connected to said multiplexer operably connected with said external pin.

23. The circuit of claim 21, further comprising:

a multiplexer operably to a user-defined logic output and a core logic output; and said multiplexer operably connected with said external pin.

24. The circuit of claim 19, wherein said logic selection circuitry connected with said core logic and user-defined logic further comprises:

a bi-directional bus interface between the integrated circuit core logic and the integrated circuit user-defined logic.

25. The circuit of claim 24, wherein said bi-directional bus interface between the integrated circuit core logic and the integrated circuit user-defined logic further includes:

signal path selection circuitry between an external pin and the bi-directional bus.

26. The circuit of claim 25, wherein said signal path selection circuitry between an external pin and the bi-directional bus further includes:

a selectable output signal path from the bi-directional bus to the external pin.

27. The circuit of claim 26, wherein said selectable output signal path from the bi-directional bus to the external pin further includes:

an output signal path enabling circuit operably connected to both a core logic output and user-defined logic output activation circuits.

28. The circuit of claim 25, wherein said signal path selection circuitry between an external pin and the bi-directional bus further includes:

a selectable input signal path from the external pin to the bi-directional bus.

29. The circuit of claim 28, wherein said selectable input signal path from the external pin to the bi-directional bus further includes:

a input signal path enabling circuit operably connected to both a core logic output and user-defined logic output deactivation circuits.

30. The circuit of claim 25, wherein said signal path selection circuitry between an external pin and the bi-directional bus further includes:

a selectable signal path between the bi-directional bus and integrated circuit logic.

31. The circuit of claim 30, wherein said selectable signal path between the bi-directional bus and integrated circuit logic further includes:

a selectable input signal path from the bi-directional bus to the integrated circuit core logic.

32. The circuit of claim 30, wherein said selectable signal path between the bi-directional bus and integrated circuit logic further includes:

a selectable output signal path from the integrated circuit core logic to the bi-directional bus.

* * * * *